United States Patent
Green

(10) Patent No.: US 7,332,799 B2
(45) Date of Patent: Feb. 19, 2008

(54) PACKAGED CHIP HAVING FEATURES FOR IMPROVED SIGNAL TRANSMISSION ON THE PACKAGE

(75) Inventor: Ronald Green, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 204 days.

(21) Appl. No.: 11/319,961

(22) Filed: Dec. 28, 2005

(65) Prior Publication Data

US 2007/0145560 A1   Jun. 28, 2007

(51) Int. Cl.
*H01L 23/02* (2006.01)
*H05K 1/18* (2006.01)

(52) U.S. Cl. ............ 257/685; 257/701; 257/702; 257/773; 257/E23.019; 257/E23.06; 257/E23.067; 361/600; 361/762; 361/763

(58) Field of Classification Search ......... 257/664, 257/678, 685, 688, 690, 691, 700–703, 693, 257/773, E23.001, E23.006–E23.009, E23.011, 257/E23.015, E23.019, E23.06, E23.067; 361/762–763
See application file for complete search history.

(56) References Cited

U.S. PATENT DOCUMENTS

| | | | |
|---|---|---|---|
| 5,161,086 A * | 11/1992 | Howard et al. | 361/321.1 |
| 5,583,376 A * | 12/1996 | Sickler et al. | 257/702 |
| 5,640,048 A * | 6/1997 | Selna | 257/738 |
| 5,708,569 A * | 1/1998 | Howard et al. | 361/760 |
| 6,072,690 A * | 6/2000 | Farooq et al. | 361/321.2 |
| 6,215,372 B1 * | 4/2001 | Novak | 333/12 |
| 6,222,276 B1 | 4/2001 | Bertin et al. | |
| 6,239,384 B1 | 5/2001 | Smith et al. | |
| 6,329,607 B1 | 12/2001 | Fjelstad et al. | |
| 6,362,525 B1 * | 3/2002 | Rahim | 257/738 |
| 6,472,735 B2 * | 10/2002 | Isaak | 257/686 |
| 7,120,031 B2 * | 10/2006 | Chakravorty et al. | 361/762 |
| 7,180,170 B2 * | 2/2007 | Celaya et al. | 257/698 |
| 2004/0032011 A1 | 2/2004 | Warner et al. | |
| 2004/0238857 A1 | 12/2004 | Beroz et al. | |

* cited by examiner

*Primary Examiner*—Jasmine Clark
(74) *Attorney, Agent, or Firm*—Lerner, David, Littenberg, Krumholz & Mentlik, LLP

(57) ABSTRACT

A packaged chip is provided which includes a package element on which a signal-bearing conductive trace has an edge laterally adjacent to an edge of a reference conductive trace (e.g., ground trace) on the same face of a dielectric element, the two traces together functioning as a capacitor. In a particular embodiment, the laterally adjacent traces provide shunt capacitance to compensate for an inductance in a signal path to the chip which includes the signal-bearing conductive trace. In a variation thereof, a transmission line or waveguide is provided which includes the signal-bearing conductive trace and reference trace. In further variations, transmission lines are provided which include one or more metal layers of a package element, separated from each other by a thickness of a dielectric element included in the package element or the air gap between the package and a circuit panel.

17 Claims, 6 Drawing Sheets

PACKAGED CHIP HAVING FEATURES FOR IMPROVED SIGNAL TRANSMISSION ON THE PACKAGE

BACKGROUND OF THE INVENTION

The present invention relates to microelectronics packaging and more specifically to apparatuses and methods for improved transmission of signals within a package to a chip mounted to the package.

The packaging of semiconductor chips, i.e., active and passive integrated circuits, micro-electromechanical devices, piezoelectric devices, etc., is becoming more challenging as the frequency response demanded from semiconductor chips increases. Increasingly, the inductance and capacitance of features on the package must be considered in solutions for improving impedance matching. Inadequate impedance matching is a cause of signal attenuation due to reflections at external boundaries of the package and the chip. Moreover, particular measures needed to address this problem vary with the frequency of the signals to be carried by the conductors on the package to and/or from the chip. While it is sometimes sufficient to reduce resistance and inductance of conductors on the package by increasing the cross-sectional area of the signal conductor and/or reducing its length, performance reaches an upper boundary after which further improvements are no longer available.

In such case, further improvements are needed which affect the kind of signal conductor provided on a package and/or which perform additional functions which are not ordinarily performed in packages on which chips are mounted.

For example, FIG. 1 illustrates a packaged chip 100 according to the prior art in which a chip 102 is mounted face up on a package element 104. As shown in FIG. 1, the package element includes a dielectric element, e.g., a layer including a polymer, viz. polyimide, on which a patterned metal layer 108 is provided. A rear surface 112 of the chip 102 is mounted to the metal layer 108, e.g., by an adhesive known as "die attach" 114. In the "circuits-in" arrangement shown in FIG. 1, the patterned metal layer 108 overlies a side of the dielectric element 106 which faces the chip 102. Bond wires 110 conductively connect bond pads 116 provided on a front face 118 of the chip to terminals 120 of the package element 104. Typically, the bond wires are long, narrow conductors which have substantial inductance and resistance, both of which tend to increase with increasing signal frequency.

Typically, the length of the bond wires is greater than the height of the chip plus the distance between the bond pads of the chip and the terminals of the chip to allow for the bond wires to bend. Moreover, the length of the bond wires is also affected by the lateral distance they must extend from the chip, mounted near a center of the package element, to terminals at the periphery of the package element. Such factors negatively affect the desirability of a wire-bonded arrangement for packaging a chip used in applications utilized at higher signal frequencies.

SUMMARY OF THE INVENTION

According to an aspect of the invention, a packaged chip is provided which includes a chip having a horizontally extending front surface and a plurality of bond pads exposed at the front surface. Also included in the packaged chip is a package element. The package element includes a dielectric element having an inner face and an outer face remote from the inner face. A plurality of chip contacts of the package element are exposed at the inner face, the plurality of chip contacts conductively connected to the plurality of bond pads of the chip. A plurality of package contacts are exposed at the outer face.

In addition, the package element includes a metal layer exposed at one of the inner face or the outer face of the dielectric element. The metal layer includes a first conductive trace and a second conductive trace, the first conductive trace having a first edge extending in a first direction and the second conductive trace having a second edge adjacent to the first edge. The second edge extends substantially in the first direction, such that the first conductive trace is in conductive communication with a signal-bearing chip contact of the plurality of chip contacts and with a signal-bearing package contact of the plurality of package contacts. The metal layer further includes a second conductive trace in conductive communication with a ground chip contact of the plurality of chip contacts and in conductive communication with a ground package contact of the plurality of package contacts. In such way, the first and second conductive traces function as first and second plates, respectively, of a capacitor, the capacitor connected in parallel with a signal path through the first conductive trace.

In accordance with a particular aspect of the invention, each of the first and second conductive traces includes a finger portion, and the finger portion of the first conductive trace is interdigitated with the finger portion of the second conductive trace.

In accordance with a particular aspect of the invention, each of the first and second conductive traces includes a main portion and the finger portion, the first and second edges of the conductive traces being edges of the finger portions.

In a preferred embodiment, the plurality of package contacts includes a plurality of metal pins. Preferably, the metal pins include first and second metal pins joined to and protruding from the first and second conductive traces through the dielectric element.

In an embodiment which includes such metal pins, a capacitance of the capacitor compensates for an inductance of the signal path through a first metal pin of the plurality of metal pins and the first conductive trace.

In a particular embodiment, the first conductive trace further includes a peripheral edge opposite the first edge, and the package element further includes a third conductive trace. The first and third conductive traces function as first and second plates, respectively, of a second capacitor. The second capacitor is connected in parallel with the signal path through the first conductive trace.

In accordance with a further preferred embodiment of the invention, each of the first and third conductive traces includes a finger portion. In such case, the finger portion of the first conductive trace is interdigitated with the finger portion of the third conductive trace.

In accordance with a further preferred embodiment, the plurality of package contacts include a first lead portion of the metal layer and a second lead portion of the metal layer. The first lead portion and the second lead portion are formed integrally with the first and second conductive traces, respectively.

In accordance with another aspect of the invention, a packaged chip is provided which includes a chip which has a horizontally extending front surface and a plurality of bond pads exposed at the front surface. The packaged chip further includes a package element which includes a dielectric element having an inner face and an outer face remote from the inner face. A plurality of chip contacts are exposed at the inner face, the chip contacts being conductively connected to the plurality of bond pads of the chip. A plurality of package contacts are exposed at the outer face. A metal layer is exposed at one of the inner face or the outer face of the dielectric element. The metal layer includes a first conductive trace and a second conductive trace. The first conductive trace has a first edge which extends in a first direction. The second conductive trace has a second edge adjacent to the first edge, and the second edge extends substantially in the first direction. The first conductive trace is in conductive communication with a signal-bearing chip contact of the plurality of chip contacts and with a signal-bearing package contact of the plurality of package contacts.

The metal layer further includes a second conductive trace in conductive communication with a ground chip contact of the plurality of chip contacts and in conductive communication with a ground package contact of the plurality of package contacts. In this way, the first and second conductive traces function as a signal-bearing conductor and as a ground conductor, respectively, of a transmission line.

A packaged chip in accordance with another aspect of the invention includes a chip which has a horizontally extending front surface and a plurality of bond pads exposed at the front surface. The packaged chip further includes a package element which includes a dielectric element having an inner face and an outer face remote from the inner face. A plurality of chip contacts are exposed at the inner face, the plurality of chip contacts being conductively connected to the plurality of bond pads of the chip. A plurality of package contacts are exposed at the outer face.

In addition, a metal layer is exposed at one of the inner face or the outer face of the dielectric element. The metal layer includes a first conductive trace and a second conductive trace. The first conductive trace has a first edge extending in a first direction and the second conductive trace has a second edge adjacent to the first edge, the second edge extending substantially in the first direction. The first conductive trace is in conductive communication with a signal-bearing chip contact of the plurality of chip contacts and with a signal-bearing package contact of the plurality of package contacts. The metal layer further includes a second conductive trace in conductive communication with a ground chip contact of the plurality of chip contacts and in conductive communication with a ground package contact of the plurality of package contacts. In this way, in such packaged chip, the first and second conductive traces function as walls of a waveguide for conducting a signal in a direction of the first edge of the first conductive trace.

In accordance with another aspect of the invention, an assembly is provided which includes a packaged chip. Such assembly includes a chip having a front surface and a plurality of bond pads exposed at the front surface, and a package element. The package element includes a dielectric element having an inner face and an outer face remote from the inner face and a plurality of chip contacts exposed at the inner face. The chip contacts are conductively connected to the bond pads of the chip. In addition, a plurality of package contacts are exposed at the outer face of the package element. A metal layer is also exposed at one of the inner and outer faces, the metal layer including a first package trace.

The assembly further includes a circuit panel including a dielectric element and a metal first circuit panel trace exposed at one of the inner and outer faces of the dielectric element. A substantially constant vertical spacing is maintained within the assembly between the first package trace and the first circuit panel trace. In this way, the first package trace and the first circuit panel trace form a transmission line for conducting a signal within the assembly.

In accordance with a preferred aspect of the invention, the circuit panel trace includes a ground plane.

In accordance with a preferred aspect of the invention, the dielectric element of the circuit panel has front face, a rear face remote from the front face, and a plurality of signal traces exposed at the front face, wherein the ground plane is exposed at rear face of the circuit panel.

In accordance with another aspect of the invention, an assembly is provided which includes a packaged chip. Such packaged chip includes a chip which has a front surface and a plurality of bond pads exposed at the front surface. A package element is further included in the packaged chip. The package element includes a dielectric element which has an inner face and an outer face remote from the inner face. A plurality of chip contacts are exposed at the inner face of the package element, the plurality of chip contacts being conductively connected to the plurality of bond pads of the chip. A plurality of package contacts are exposed at the outer face. The package element further includes a first metal layer exposed at a first one of the inner and outer faces, the first metal layer including a plurality of first package traces. A second metal layer includes at least one ground trace exposed at a second one of the inner and outer faces, such that at least one first package trace of the plurality of first package traces is spaced from the at least one ground trace by a thickness of the dielectric element. In this way, the at least one first package trace and the at least one ground trace form a transmission line for conducting a signal within the assembly.

In accordance with a particular aspect of the invention, the spacing between the package trace and the ground trace, including the thickness of the dielectric element of the package element and the air gap, is at least 100 microns.

In accordance with a further preferred aspect of the invention, the package element further includes a plurality of signal contacts for transferring signals in at least one of a) a direction towards the packaged chip and b) a direction away from the packaged chip. In addition, a plurality of ground contacts are provided in which each at least some of the plurality of signal contacts are surrounded by a plurality of the ground contacts in a vertical coaxial arrangement.

DETAILED DESCRIPTION

In view of the foregoing, apparatuses and methods are provided in accordance with embodiments of the invention in which conductive features are provided as elements of the package for improving signal transmission within the package.

Figure 2:
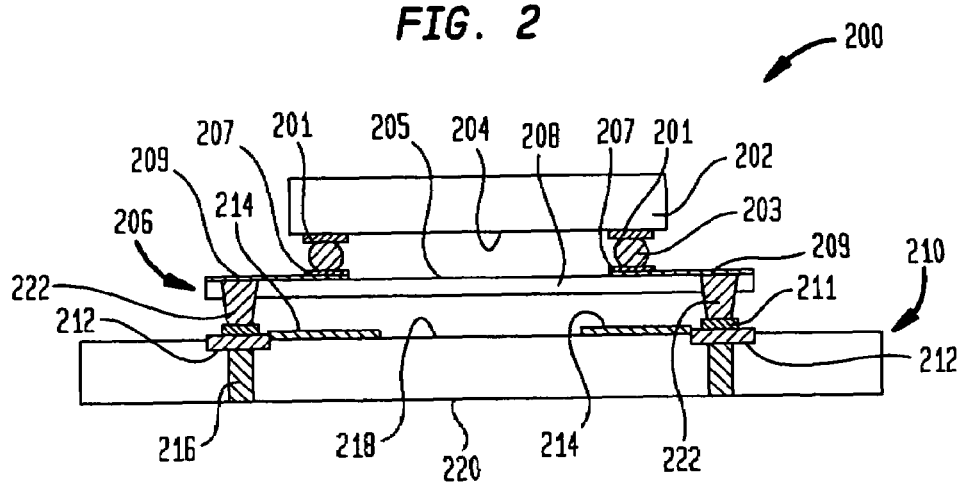
FIG. 2 is a sectional view of a packaged chip through line 2-2 of FIG. 3, as conductively connected to a circuit panel in accordance with an embodiment of the invention.

FIG. 2 is a diagram providing a sectional view of a packaged chip 200, as conductively connected to a circuit panel 210. Within the packaged chip 200, bond pads 201 on a front face 204 of a chip 202 (e.g., semiconductor chip or microelectronic or micro-electromechanical chip) are mounted via solder masses or solder balls 203 to a set of chip contacts 207 provided on an inner face 205 of a package element 206. The package element 206 includes a dielectric element 208, on which a patterned metal layer is disposed. The dielectric element can include a substantially rigid dielectric element including a material such as glass, ceramic, semiconductor material, or the like, e.g. undoped silicon, in which case the dielectric element preferably has a coefficient of thermal expansion ("CTE") close to that of the semiconductor material, e.g., silicon, of which the chip is constructed. Alternatively, the dielectric element can include one or more polymers, especially those having a CTE close to or below that of the semiconductor chip, and/or which have low modulus of elasticity, making them more likely to flex and give when the dielectric element expands differentially in relation to the chip. For example, polyimide is a preferred material for inclusion in the dielectric element because of its dielectric properties, its low CTE and its modulus of elasticity which is not high.

The chip contacts of the package element are in conductive communication with a plurality of conductive traces 209 of the metal layer. In the particular arrangement shown in FIG. 2, the metal layer including the conductive traces 209 is disposed on an inner face 205 of the dielectric element 208, the inner face facing the chip 202, i.e., in a "circuits-in" arrangement. The metal layer is preferably provided as a patterned layer of copper, gold, silver, nickel, platinum or other preferably highly conductive, e.g., noble metal overlying the dielectric element. Alternatively, an inlaid or "damascene" structure can be provided in which the patterned metal lines are embedded at or below the surface of the dielectric element. Additive, subtractive or a combination of additive and subtractive processing can be used to form the patterned metal layer. In a preferred example, the dielectric element is a tape-like structure including polyimide and the patterned metal layer includes conductive traces consisting essentially of copper, over which an optional bonding and/or oxidation-preventing layer of gold or layers of tin and gold may be successively formed.

Figure 1:
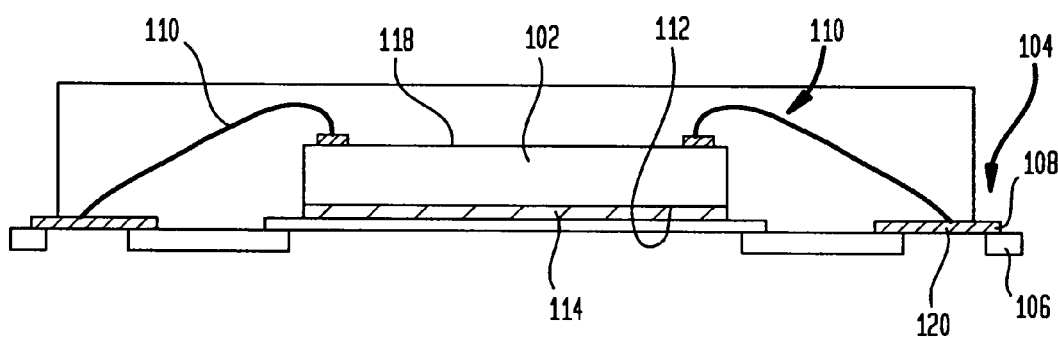
FIG. 1 is a sectional view illustrating a packaged chip 100 according to the prior art.

As evident from the foregoing description, the packaged chip 200 utilizes a significantly different way of providing conductive interconnection between the chip 202 and the package element 206 than that described above with reference to FIG. 1. In the packaged chip 200 (FIG. 2), the lengths of signal conductors are significantly reduced and their cross-sectional area is significantly increased by eliminating bond wires. In place of the bond wires, the chip 202 is interconnected to the package element 206 by solder masses or balls 203 having low height and cross-sectional area that is proportionally large for their height. In addition, the conductive traces being desirably wide, are relatively large in cross-section, so as to reduce resistance and inductance.

A plurality of package contacts 222 are preferably provided in form of conductive posts in conductive communication with the traces 209, and extending downwardly therefrom through the dielectric element 208. The package contacts 222 are joined to the terminals 212 of the circuit panel 210, as by solder masses 211. The package contacts 222 also have relatively low height and large cross-section. The circuit panel 210 includes a plurality of terminals 212, the terminals being connected to traces 214 which extend along a surface of the circuit panel. The terminals are also connected to conductive vias 216 which extend through the circuit panel from a top surface 218 of the circuit panel to a bottom surface 220 thereof. The conductive vias can be, for example, plated through holes, filled through holes, or conductive posts, e.g., metal posts, among others. The form of conductive interconnection between the chip 202 and the package element 206 and the form of conductive interconnection between the package element 206 and the circuit panel 210 tend to have lower resistance and lower inductance than the conductive interconnections that are provided according to the prior art packaged chip which is shown and described above with reference to FIG. 1.

Figure 3:
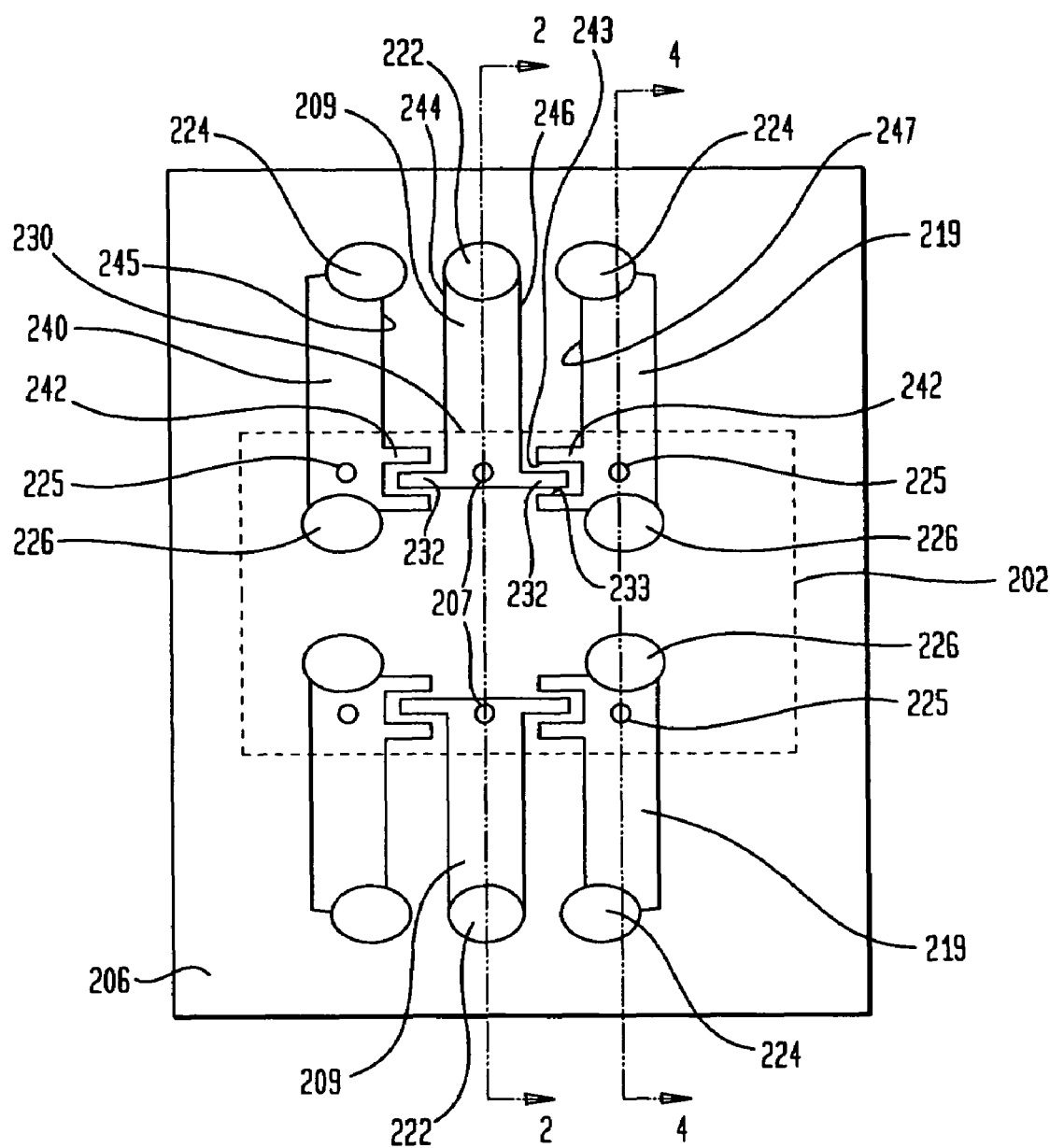
FIG. 3 is a top plan view of a package element included in the packaged chip in accordance with the embodiment of the invention illustrated in FIG. 2.

FIG. 3 is a top plan view of the package element 206 (FIG. 2) in accordance with a particular embodiment of the invention, in which an inductance associated with the signal path of one of the signal-bearing conductive traces is compensated by a shunt capacitor connected in parallel between such signal-bearing trace 209 and ground. Compensation by the addition of a capacitor provides a matched impedance termination to the conductive trace, helping to avoid the above-described problem of attenuation due to reflections at a boundary between an external transmission line and the package or between the package and the chip. With the shunt capacitor added to the structure, improved frequency response marked by decreased return loss and lower insertion loss can be achieved. In a particular example, an inductance having a value from a few tenths of a nanohenry (nH) to a few henrys can be compensated by an on-package capacitor provided in the manner described in the following with reference to FIG. 3.

As shown in FIG. 3, one end of a signal-bearing conductive trace 209 conductively communicates with a signal-bearing chip contact 207 that is connected to the chip 202 (shown in outline form by dotted line) through a solder ball 203 (FIG. 2). At another end of the signal-bearing conductive trace 209, the trace is also in conductive communication with the package contact 222, the package contact 222 providing conductive interconnection to the circuit panel 210 (FIG. 2). For ease of illustration, only one such signal-bearing conductive trace 209 is shown, although preferably the package element 206 includes a plurality of such signal-bearing conductive traces.

Figure 4:
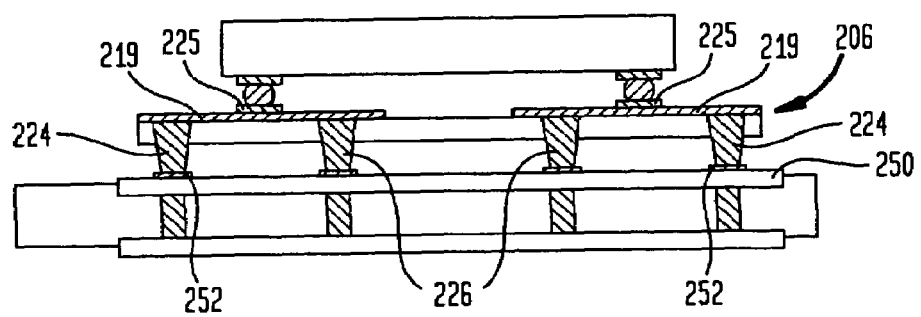
FIG. 4 is a further sectional view of the packaged chip through line 4-4 of FIG. 3, as conductively connected to circuit panel.

In addition, the package element 206 also includes a plurality of ground traces 219, the ground traces also being conductively connected to the chip through ground chip contacts 225. In addition, the ground traces are conductively connected to the circuit panel (210; FIG. 2) through ground package contacts 224. FIG. 4 provides a corresponding sectional view of the packaged chip 200 as conductively connected to circuit panel 210 through line 4-4 of FIG. 3. As further shown in FIG. 4, the ground chip contacts 225 provided on the package element 206 conductively communicate with package contacts, e.g., conductive posts, as described above, through the ground traces 219. The conductive posts, in turn, are conductively connected to one or more ground conductors 250 of the circuit panel, illustratively via solder masses 252. The ground conductors, in turn, connect to a ground plane 254 of the circuit panel via conductive vias which extend through the circuit panel 210.

Referring again to FIG. 3, preferably, each of the signal-bearing traces 209 includes a main portion 230 and a finger portion 232. Similarly, each of the ground traces 219 includes a main portion 240 and a finger portion 242. As shown in FIG. 3, the finger portion 232 of the signal-bearing trace is interdigitated with the finger portions 242 of the ground traces. Each finger portion 232 of the signal-bearing trace has an edge 233 and each finger portion 242 of the ground traces has edges 243 which are disposed adjacent to and run parallel to the edges 233 of the finger portion 232. In this way, capacitors are provided by the combination of the signal-bearing trace juxtaposed to the ground traces adjacent thereto. The presence of the finger portions jutting outward from the main portions of the traces increases proximity between the finger portions of the signal-bearing trace and the finger portions of the ground traces.

In an alternative embodiment, the conductive traces do not include the finger portions shown in FIG. 3 such that they have an appearance much like that shown and described below with reference to FIG. 6. Referring again to FIG. 3, in such alternative embodiment, the layout of the package element can be such that a left edge 244 of the main portion 230 of the signal-bearing trace 209 is placed as close as possible to an adjacent edge 245 of a main portion of the ground trace adjacent to that left edge. In addition, preferably a right edge 246 of the main portion 230 of the signal-bearing trace 209 is placed as close as possible to an adjacent edge 247 of a main portion of the ground trace 219 adjacent to that right edge.

Figure 5:
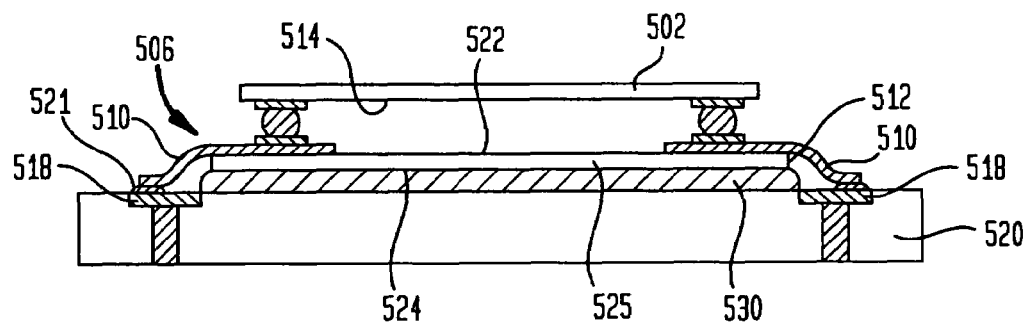
FIG. 5 is a sectional view of a packaged chip, as connected to a circuit panel, in accordance with a variation of the embodiment shown in FIGS. 2, 3 and 4.

A variation of the embodiment described above with reference to FIGS. 2, 3 and 4 is shown in FIG. 5 in which package contacts are provided in the form of a plurality of conductive metallic leads 510 which extend beyond peripheral edges 512 of the package element. In a particular embodiment, the leads are formed integrally with the conductive traces as patterned elements of the same metal layer from which the conductive traces are patterned. For example, the leads may be provided by any one or more of the processes described in the commonly owned U.S. patent applications published as U.S. Patent Publication Nos. 2004-0032011 and 2004-0238857, the disclosures of which are hereby incorporated by reference herein. As such, the leads are deformed in a direction away from the front face 514 of the chip, i.e., in a direction away from that front face 514 towards a circuit panel 520. The leads are preferably deformable either prior to bonding the chip 502 to the package element 506 or subsequent thereto when the leads 512 of the package element 512 are conductively bonded, as by solder masses 521, to terminals 518 of the circuit panel 520.

The arrangement illustrated in FIG. 5 is a "circuits-in" arrangement in which the conductive traces 511 are disposed on an inner face 522 of a dielectric element 525 included in the package element 506. In a variation thereof, the conductive traces can be provided in accordance with a "circuits-out" arrangement in which the conductive traces are disposed on an outer face 524 of the dielectric element 525. Optionally, a thermally conductive underfill 530, preferably having a low modulus, may be disposed between the outer face 524 of the dielectric element and a top surface of the circuit panel.

Figure 6:
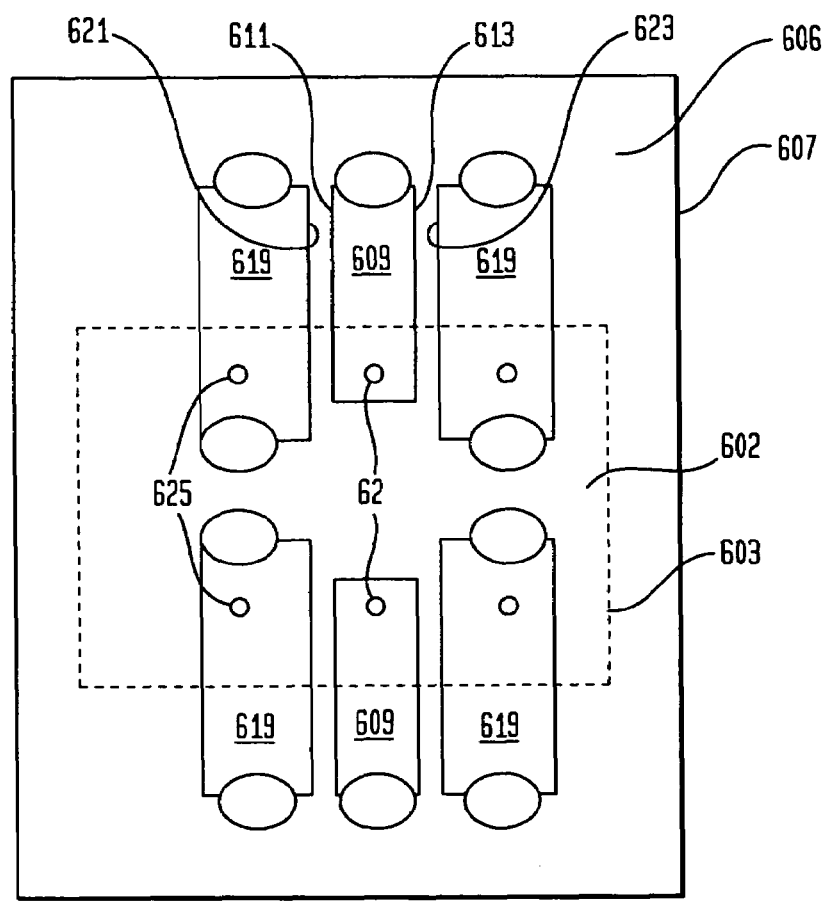
FIG. 6 is a top plan view of a package element included in a packaged chip in accordance with a variation of the embodiment of the invention illustrated in FIG. 2.

FIG. 6 is a top plan view illustrating a package element 606 (the outline 607 of which is shown in dotted line form) incorporated in a packaged chip for connection to a circuit panel in accordance with another embodiment of the invention. Such embodiment is similar to the embodiment described above with reference to FIGS. 2-4, except to the extent that the package element 606, in particular, differs from the above-described package element 206 (FIG. 3). As shown in FIG. 6, the package element 606 includes a plurality of signal-bearing conductive traces 609 and a plurality of ground conductive traces 619, all of which are disposed on a face of a dielectric element included within the package element. The package element is conductively connected to a chip 602 (the outline 603 of which is shown in dotted line form) which overlies the package element, by way of a plurality of signal-bearing chip contacts 623 and ground chip contacts 625.

In the embodiment of the invention shown in FIG. 6, one such signal-bearing trace 609 and one of the ground traces 619 in close proximity thereto function together as a transmission line for transmitting signals along the face of the dielectric element of the package element 606. As particularly shown in FIG. 6, there are two ground traces 619 in close proximity to each signal-bearing trace 609 of the package element. The ground traces 619 function as reference (ground) conductors of a transmission line formed by the combination of the signal-bearing trace and the ground traces.

However, another way that the combination of the signal-bearing trace 609 and ground traces 619 can function is as a set of parallel waveguides. A first waveguide is formed by the juxtaposition of a left edge 611 of the signal-bearing trace 609 to the parallel adjacent edge 621 of one of the ground traces 619 on a left side of the signal-bearing trace. In such first waveguide, these edges function as walls of the waveguide between which is a gap filled by a dielectric, e.g., air or other dielectric medium. A second waveguide is formed by the juxtaposition of the right edge 613 of the signal-bearing trace 619 to the parallel adjacent edge 623 of one of the ground traces 619 on a right side of the signal-bearing trace. Likewise, in such second waveguide, these edges function as walls of the waveguide between which is a gap filled by a dielectric, e.g., air or other dielectric medium.

Figure 7:
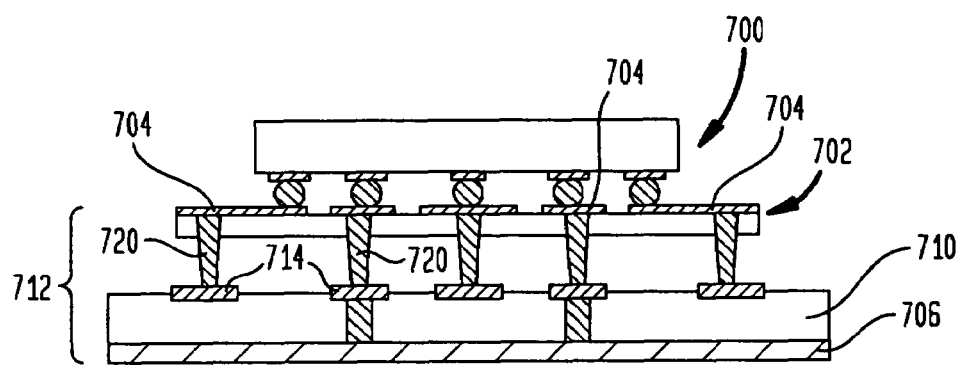
FIG. 7 is a sectional view of a packaged chip, as conductively connected to a circuit panel in accordance with a further embodiment of the invention.

FIG. 7 is a sectional view illustrating an assembly 700 including a packaged chip, as connected to a circuit panel, in accordance with an embodiment of the invention. The structures and features shown therein are similar to those shown and described above with reference to FIGS. 2-4 except as particularly described herein. In this embodiment, conductive traces 704 provided on the package element 702 are uniformly spaced from conductive traces or a ground plane 706 on the circuit panel 710 to form transmission lines 712 of the type known as microstrip lines. Through selection of appropriate width of the conductive traces and distance between the traces and the ground plane 706, the microstrip lines can be controlled to have a desired value of characteristic impedance. Here, the thickness and characteristics (e.g., the dielectric constant, among others) of the dielectric material from which the circuit panel 710 is constructed and the characteristics of the conductive traces or ground plane 706 are specified in such way that the resulting transmission lines have a desired characteristic impedance value, such as a typical standard value of 50 ohms. The characteristic impedance of the transmission lines is determined by a ratio of the width of the conductive traces that overlies the ground plane to the distance that separates them, given the dielectric constant of the dielectric material that separates the traces from the ground plane. As seen in FIG. 7, part of the dielectric material between traces 704 and 706 is the polyimide material within the package element 702, part is the dielectric material in the circuit panel, and another part is the air between the package element and the circuit panel. The length, i.e., the height of conductive posts 720 from the terminals 714 of the circuit panel extending to the traces 704 on the package element and the thickness and characteristics (i.e., the dielectric constant, among others) of the dielectric material from which the package element is constructed are specified to achieve transmission lines having a desired characteristic impedance and frequency response. For example, the air that fills the gap between elements of the packaged chip and the circuit panel and a polyimide layer of package element are low loss dielectrics. These dielectrics are better suited to signal transmission at higher frequencies, e.g., 10-30 Hz, than other more lossy dielectric materials such as ceramics and conventional FR-4, e.g., epoxy-fiberglass dielectrics of circuit panels.

In this way, the packaged chip and the circuit panel are modeled and designed together as one unit. As a result, the frequency response (as measured by return loss and insertion loss) of the unit of the packaged chip and the attached circuit panel can be improved and the cutoff frequency of the unit can be raised to a desirably high frequency.

Figure 8:
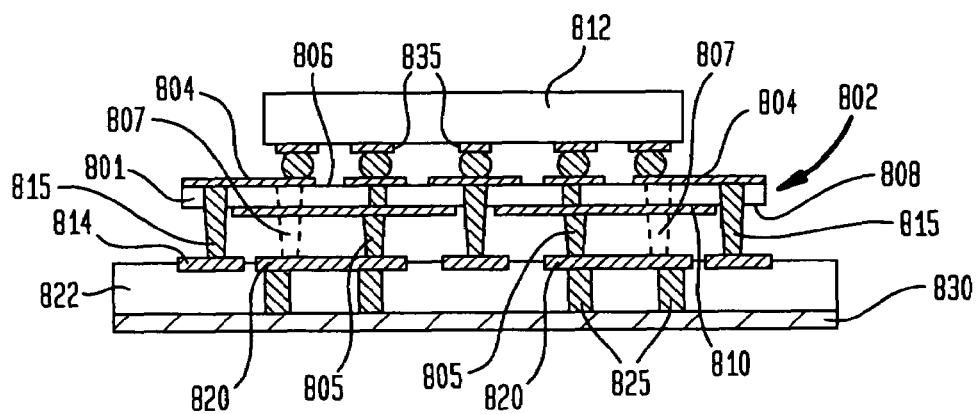
FIG. 8 is a sectional view of a packaged chip, as conductively connected to a circuit panel in accordance with a particular embodiment of the invention.

FIG. 8 illustrates a particular embodiment, similar to that described above with respect to FIG. 7, but in which the package element 802 includes a dielectric element 801 and two patterned metal layers. One patterned metal layer includes a plurality of conductive traces 804 disposed on an inner surface 806 of the dielectric element 801 facing the chip 812. A second patterned metal layer includes a ground plane 810 disposed on an outer surface 808 of the dielectric element 801. Preferably, the ground plane 810 covers a large area of the outer surface of the dielectric element, particularly in locations opposite the thickness of the dielectric element 801 from the conductive traces 804 disposed on the inner surface. However, desirably, the ground plane is not disposed in locations overlying the dielectric element opposite the chip 812 itself. In the portion of the package element 802 that the chip overlies, the ground plane preferably includes an opening of about the same size and location as the chip, to reduce effects of "frequency pulling".

The frequency response of a chip or other component tends to be adversely affected (manifesting an increase or decrease in frequency, i.e., appearing to be "pulled") due to proximity between a reactive element of that component and an external conductor. The interaction between the reactive element and the ground plane changes the value of the reactive impedance, thus changing the performance of the chip. Reactive elements included in a chip, such as inductors and capacitors, should generally not be placed closer than 100 microns (µm) to a ground plane or other significant conductor, because of frequency pulling. One way that frequency pulling is avoided is by placing the front surface of the chip a distance 125 µm or greater away from the nearest ground plane, such as a ground plane provided on the surface of the circuit panel. When the package element includes a ground plane, providing a hole in that ground plane mitigates frequency pulling between the chip and the package element.

Preferably, as shown in FIG. 8, the package element 802 includes a plurality of ground posts 805 which further interconnect the package element 802 to ground pads 835 of the chip and to a ground plane 820 of the circuit panel. Desirably, many such posts are provided to reduce series inductance between the packaged chip and the circuit panel and to increase stability of the ground. In particular, additional ground posts 807 connecting ground posts of the chip to the ground plane 820, are shown in dotted outline form. These posts 807 are within a section of the chip that is either in front of or behind the section shown in FIG. 8 (with respect to the plane of the sheet on which the drawing is illustrated), such that these ground posts 807 are not conductively connected to signal traces 804.

The ground plane 820 provided on an upper surface of the circuit panel is optionally further connected by conductive vias 825 to a further ground plane 830 disposed on a lower surface of the circuit panel.

Figure 9A:
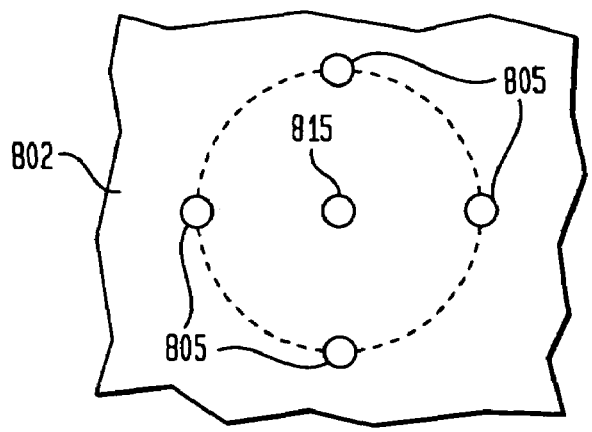
FIGS. 9A and 9B are partial plan views illustrating an arrangement of signal posts to ground posts in accordance with particular embodiments of the invention.
Figure 9B:
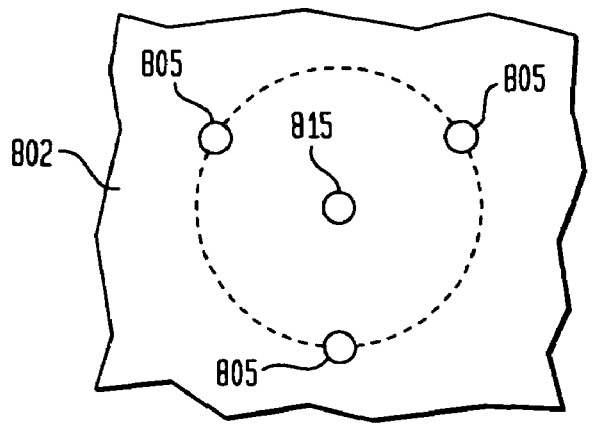

As further shown in FIG. 8, a plurality of conductive posts 815 conduct signals from signal conductive traces 804 provided on the inner surface 806 of the package element 802 to signal terminals 814 on the circuit panel 822. Desirably, as shown in the partial plan views of FIG. 9A and FIG. 9B (looking toward the face of the package element 802), a plurality of ground conductive posts 805 are placed in proximity to the signal conductive posts 815, and preferably surround each signal post. When a signal post is ringed by a plurality of ground posts, especially three, four or more posts, which are held at ground or other fixed potential, and at uniform spacing from the signal post, the combination of ground posts and signal posts behave more like a coaxial transmission line. Signal transmission through these posts over such "vertical transmission line" is less lossy and reflections can be mitigated to a much greater degree than when this relationship is not present between signal posts and ground posts.

Figure 10:
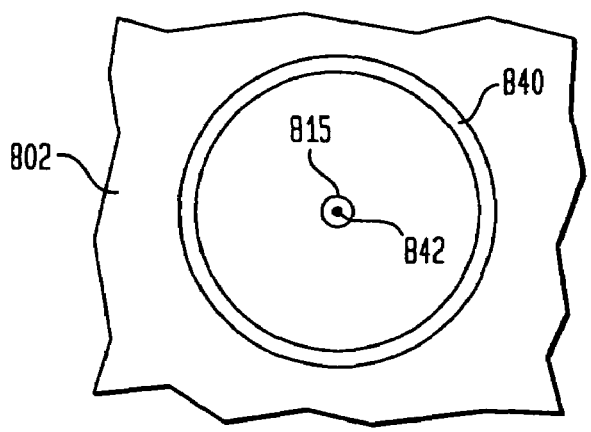
FIG. 10 is a partial plan view illustrating a coaxial arrangement of a signal post and a cylindrical ground conductor in accordance with a particular embodiment of the invention.

Alternatively, a truer coaxial transmission line can be achieved if, instead of using a plurality of ground posts, a cylindrical ground conductor 840 (FIG. 10) is provided, such that its center 842 is aligned with the center of the signal post. Such variation is shown in the partial plan view of FIG. 10 looking towards the face of the package element 802.

In such arrangement, frequency response is improved such that the cutoff frequency can be increased, desirably to a level of 30 GHz or higher, for example. Here, the material of the dielectric element and its thickness contribute to how well the desired performance is achieved. Accordingly, it is preferred for the material characteristics of the dielectric element to be controlled especially for its use at frequencies of several tens of gigahertz. Polyimide is an acceptable material therefor. Some control over the choice of dielectric material is needed to assure that the dielectric material performs acceptably at those frequencies. In addition, it is desired that the thickness of such dielectric element, when fabricated of polyimide, for example, be relatively small, such that the thickness of the dielectric is small compared to the total height of the posts which span the air gap in view of generally better dielectric characteristics of air compared to solid dielectric materials.

As shown and described above with reference to FIG. 8, an embodiment is provided in which the conductive signal traces 804 of the package and contacts connected to the chip are all provided in a circuits-in arrangement on an inner surface 806 of the package element; i.e., on the side facing the chip and facing away from the circuit panel 822. In such case, the characteristics of the microstrip transmission lines between those conductive traces and the chip are determined, at least in part, upon the dielectric characteristics of the package element 802. However, instead of such circuits-in arrangement, the conductive signal traces 804 can be provided on the outer surface 808 of the package element (the surface facing the circuit panel 822). Then the height or thickness of the dielectric of the transmission lines between the signal traces 804 on the package element 802 and the circuit panel 822 is decreased to the height of the air gap between them. In addition, the transmission lines have only air as the dielectric medium, providing better characteristics than with available solid dielectric media as described above.

In another variation of embodiment described above with reference to FIG. 8, the signal traces are embedded in an interior metal layer of the package element. Ground conductors or ground planes are disposed in exterior metal layers on the top and bottom surfaces of the package element. In this way, fully shielded transmission lines are provided which yield even better frequency response than the microstrip arrangement specifically illustrated in FIG. 8.

As these and other variations and combinations of the features discussed above can be utilized without departing from the present invention, the foregoing discussion of the preferred embodiment should be taken by way of illustration rather than by way of limitation of the present invention.

The invention claimed is:

1. A packaged chip, comprising:
  a chip having a horizontally extending front surface and a plurality of bond pads exposed at said front surface;
  a package element, said package element including:
    a dielectric element having an inner face and an outer face remote from said inner face,
    a plurality of chip contacts exposed at said inner face, said plurality of chip contacts conductively connected to said plurality of bond pads of said chip,
    a plurality of package contacts exposed at said outer face,
    a metal layer exposed at one of said inner face or said outer face of said dielectric element, said metal layer including a first conductive trace and a second conductive trace, said first conductive trace having a first edge extending in a first direction and said second conductive trace having a second edge adjacent to said first edge, said second edge extending substantially in said first direction, said first conductive trace being in conductive communication with a signal-bearing chip contact of said plurality of chip contacts and with a signal-bearing package contact of said plurality of package contacts, said metal layer further including a second conductive trace in conductive communication with a ground chip contact of said plurality of chip contacts and in conductive communication with a ground package contact of said plurality of package contacts,
    said first and second conductive traces functioning as first and second plates, respectively, of a capacitor, said capacitor connected in parallel with a signal path through said first conductive trace.

2. The packaged chip as claimed in claim 1, wherein said first and second conductive traces each includes a finger portion, said finger portion of said first conductive trace being interdigitated with said finger portion of said second conductive trace.

3. The packaged chip as claimed in claim 2, wherein each of said first and second conductive traces includes a main portion and said finger portion, said first and second edges of said conductive traces being edges of said finger portions.

4. The packaged chip as claimed in claim 1, wherein said plurality of package contacts includes a plurality of metal pins.

5. The packaged chip as claimed in claim 4, wherein said plurality of metal pins includes first and second metal pins joined to and protruding from said first and second conductive traces through said dielectric element.

6. The packaged chip as claimed in claim 4, wherein a capacitance of said capacitor compensates for an inductance of said signal path through a first metal pin of said plurality of metal pins and said first conductive trace.

7. The packaged chip as claimed in claim 4, wherein said first conductive trace further includes a peripheral edge opposite said first edge, and said package element further includes a third conductive trace, such that said first and third conductive traces function as first and second plates, respectively, of a second capacitor, said second capacitor being connected in parallel with said signal path through said first conductive trace.

8. The packaged chip as claimed in claim 7, wherein said first and third conductive traces each includes a finger portion, said finger portion of said first conductive trace being interdigitated with said finger portion of said third conductive trace.

9. The packaged chip as claimed in claim 8, wherein said plurality of package contacts include a first lead portion of said metal layer and a second lead portion of said metal layer, said first lead portion and said second lead portion being formed integrally with said first and second conductive traces, respectively.

10. A packaged chip, comprising:
  a chip having a horizontally extending front surface and a plurality of bond pads exposed at said front surface;
  a package element, said package element including:
    a dielectric element having an inner face and an outer face remote from said inner face,
    a plurality of chip contacts exposed at said inner face, said plurality of chip contacts conductively connected to said plurality of bond pads of said chip,
    a plurality of package contacts exposed at said outer face,
    a metal layer exposed at one of said inner face or said outer face of said dielectric element, said metal layer including a first conductive trace and a second conductive trace, said first conductive trace having a first edge extending in a first direction and said second conductive trace having a second edge adjacent to said first edge, said second edge extending substantially in said first direction, said first conductive trace being in conductive communication with a signal-bearing chip contact of said plurality of chip contacts and with a signal-bearing package contact of said plurality of package contacts, said metal layer further including a second conductive trace in conductive communication with a ground chip contact of said plurality of chip contacts and in conductive communication with a ground package contact of said plurality of package contacts,
    said first and second conductive traces functioning as a signal-bearing conductor and as a ground conductor, respectively, of a transmission line.

11. A packaged chip, comprising:
  a chip having a horizontally extending front surface and a plurality of bond pads exposed at said front surface;
  a package element, said package element including:

a dielectric element having an inner face and an outer face remote from said inner face, a plurality of chip contacts exposed at said inner face, said plurality of chip contacts conductively connected to said plurality of bond pads of said chip, a plurality of package contacts exposed at said outer face, a metal layer exposed at one of said inner face or said outer face of said dielectric element, said metal layer including a first conductive trace and a second conductive trace, said first conductive trace having a first edge extending in a first direction and said second conductive trace having a second edge adjacent to said first edge, said second edge extending substantially in said first direction, said first conductive trace being in conductive communication with a signal-bearing chip contact of said plurality of chip contacts and with a signal-bearing package contact of said plurality of package contacts, said metal layer further including a second conductive trace in conductive communication with a ground chip contact of said plurality of chip contacts and in conductive communication with a ground package contact of said plurality of package contacts, said first and second conductive traces functioning as walls of a waveguide for conducting a signal in a direction of said first edge of said first conductive trace.

12. An assembly including a packaged chip, comprising:
a chip having a front surface and a plurality of bond pads exposed at said front surface;
a package element including:
  a dielectric element having an inner face and an outer face remote from said inner face,
  a plurality of chip contacts exposed at said inner face, said plurality of chip contacts conductively connected to said plurality of bond pads of said chip,
  a plurality of package contacts exposed at said outer face,
  a metal layer exposed at one of said inner and outer faces, said metal layer including a first package trace,
a circuit panel including a dielectric element and a first circuit panel trace including a metal exposed at one of said inner and outer faces of said dielectric element, said first circuit panel trace including a metal such that a substantially constant vertical spacing is maintained within said assembly between said first package trace and said first circuit panel trace and said first package trace and said first circuit panel trace form a transmission line for conducting a signal within said assembly.

13. The assembly as claimed in claim 12, wherein said circuit panel trace includes a ground plane.

14. The assembly as claimed in claim 12, wherein said dielectric element of said circuit panel has front face, a rear face remote from said front face, a plurality of signal traces exposed at said front face and said ground plane is exposed at rear face of said circuit panel.

15. An assembly including a packaged chip, comprising:
a chip having a front surface and a plurality of bond pads exposed at said front surface;
a package element including:
  a dielectric element having an inner face and an outer face remote from said inner face,
  a plurality of chip contacts exposed at said inner face, said plurality of chip contacts conductively connected to said plurality of bond pads of said chip,
  a plurality of package contacts exposed at said outer face,
  a first metal layer exposed at a first one of said inner and outer faces, said first metal layer including a plurality of first package traces,
  a second metal layer including at least one ground trace exposed at a second one of said inner and outer faces, such that at least one first package trace of said plurality of first package traces is spaced from said at least one ground trace by a thickness of said dielectric element such that said at least one first package trace and said at least one ground trace form a transmission line for conducting a signal within said assembly.

16. The packaged chip as claimed in claim 15, wherein said dielectric element has a thickness of at least 100 microns.

17. The packaged chip as claimed in claim 15, wherein said package element further comprises a plurality of signal contacts for transferring signals in at least one of a) a direction towards said packaged chip and b) a direction away from said packaged chip, and a plurality of ground contacts, each at least some of said plurality of signal contacts being surrounded by a plurality of said ground contacts.

* * * * *

UNITED STATES PATENT AND TRADEMARK OFFICE
CERTIFICATE OF CORRECTION

PATENT NO. : 7,332,799 B2
APPLICATION NO. : 11/319961
DATED : February 19, 2008
INVENTOR(S) : Ronald Green It is certified that error appears in the above-identified patent and that said Letters Patent is hereby corrected as shown below:

Column 4, line 41 after "each" insert --of--.
Column 4, line 42 "are" should read --is--.
Column 6, line 7 after "traces" insert --,--.
Column 10, line 31 "behave" should read --behaves--.
Column 11, line 19 "fully shielded" should read --fully-shielded--.
Column 11, line 25 "embodiment" should read --embodiments--.
Column 14, line 7 after "has" insert --a--.
Column 14, line 10 after "at" insert --the--.

Signed and Sealed this

Seventeenth Day of March, 2009

JOHN DOLL
*Acting Director of the United States Patent and Trademark Office*